United States Patent
Otera (10) Patent No.: US 9,543,498 B2
(45) Date of Patent: Jan. 10, 2017

(54) ACTUATOR DEVICE AND METHOD FOR MANUFACTURING THE ACTUATOR DEVICE

(71) Applicant: MURATA MANUFACTURING CO., LTD., Kyoto (JP)

(72) Inventor: Shozo Otera, Kyoto (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 339 days.

(21) Appl. No.: 14/186,916

(22) Filed: Feb. 21, 2014

(65) Prior Publication Data

US 2014/0167569 A1 Jun. 19, 2014

Related U.S. Application Data

(63) Continuation of application No. PCT/JP2012/070980, filed on Aug. 20, 2012.

(30) Foreign Application Priority Data

Aug. 24, 2011 (JP) ................................ 2011-182307

(51) Int. Cl.
 *H01L 41/08* (2006.01)
 *H01L 41/09* (2006.01)
 (Continued)

(52) U.S. Cl.
 CPC ........... *H01L 41/09* (2013.01); *H01L 41/0471* (2013.01); *H01L 41/0805* (2013.01);
 (Continued)

(58) Field of Classification Search
 CPC ................................ H03H 9/19; H01L 41/047
 (Continued)

(56) References Cited

U.S. PATENT DOCUMENTS

| | | | | |
|---|---|---|---|---|
| 6,278,222 B1* | 8/2001 | Katsuragi | ........... | H01L 41/0836 310/323.17 |
| 2010/0066212 A1* | 3/2010 | Denneler | ................ | H01L 41/29 310/363 |
| 2011/0074253 A1* | 3/2011 | Hino | ....................... | F03G 7/005 310/365 |

FOREIGN PATENT DOCUMENTS

| | | |
|---|---|---|
| JP | 30-010538 Y1 | 7/1955 |
| JP | 5-087974 U | 11/1993 |

(Continued)

OTHER PUBLICATIONS

International Search Report; PCT/JP2012/070980; Sep. 18, 2012.
Written Opinion of the International Searching Authority; PCT/JP2012/070980; Sep. 18, 2012.

*Primary Examiner* — Derek Rosenau
(74) *Attorney, Agent, or Firm* — Studebaker & Brackett PC (57) ABSTRACT

An actuator device and a method for manufacturing the actuator device, which is formed by stacking and rolling films of electrostrictive material into a cylindrical body and can ensure electrical connection with inner electrodes at both end portions of the cylindrical body. The actuator device is formed by stacking and rolling two films of electrostrictive material into a cylindrical body, the two films each having an inner electrode on one or both surfaces thereof. The cylindrical body has at least one cut portion at each end portion thereof, the cut portion being configured to reach the inner electrode (electrode pattern). By applying conductive ink to each of the cut portions, the conductive ink flows through the cut portions and reaches the inner electrodes on the films. By heat-hardening the conductive ink, it is possible to ensure electrical connection between outer and inner electrodes.

6 Claims, 5 Drawing Sheets

(51) Int. Cl.
  *H01L 41/193* (2006.01)
  *H01L 41/083* (2006.01)
  *H01L 41/27* (2013.01)
  *H01L 41/293* (2013.01)
  *H01L 41/047* (2006.01)
  *H01L 41/277* (2013.01)
  *H01L 41/314* (2013.01)

(52) U.S. Cl.
  CPC ........ *H01L 41/0836* (2013.01); *H01L 41/193* (2013.01); *H01L 41/27* (2013.01); *H01L 41/277* (2013.01); *H01L 41/293* (2013.01); *H01L 41/314* (2013.01)

(58) Field of Classification Search
  USPC .................................... 310/365, 366, 369
  See application file for complete search history.

(56) References Cited

FOREIGN PATENT DOCUMENTS

| | | |
|---|---|---|
| JP | 08-265897 A | 10/1996 |
| JP | 09-232185 A | 9/1997 |
| JP | 2003-052182 A | 2/2003 |
| JP | 2003-199365 A | 7/2003 |

\* cited by examiner

ACTUATOR DEVICE AND METHOD FOR MANUFACTURING THE ACTUATOR DEVICE

CROSS REFERENCE TO RELATED APPLICATIONS

This application claims benefit of priority to Japanese Patent Application No. 2011-182307 filed on Aug. 24, 2011, and to International Patent Application No. PCT/JP2012/070980 filed on Aug. 20, 2012, the entire content of each of which is incorporated herein by reference.

TECHNICAL FIELD

The present technical field relates to an actuator device formed by stacking and rolling films of electrostrictive material into a cylindrical body, and to a method for manufacturing the actuator device.

BACKGROUND

Medical equipment and industrial robots are often required to move with high precision. Therefore, it is imperative to develop compact, lightweight, and flexible actuator devices. For example, many actuator devices have been developed, which use a flexible member formed by bonding two sheets of electrostrictive material together.

Recently, to realize actuator devices of lighter weight, actuator devices using films of electrostrictive material have been developed. Films made of electrostrictive material are stacked in layers to form a multilayer body, which functions as an actuator device by T-shaped connection of electrodes using conductive paste or the like, the electrodes being exposed by cutting to a cross section of the multilayer body.

To enhance the strength of an actuator device, for example, as in a film capacitor disclosed in Japanese Unexamined Patent Application Publication No. 09-232185, films made of electrostrictive material are stacked to form a multilayer body, which is rolled and used as a cylindrical actuator device. In Japanese Unexamined Patent Application Publication No. 09-232185, a metal, such as Al, Cu, or Au, is used in electrodes. Outer electrodes are formed by thermal spraying of metal onto both end portions of the cylindrical actuator device.

SUMMARY

Technical Problem

The structure described in Japanese Unexamined Patent Application Publication No. 09-232185 can be used without any problem as a capacitor. However, when used as an actuator device, the structure has a problem in that, because displacement is restricted by inner electrodes made of metal, strains in the electrostrictive material may be reduced. Some attempts have been made which involve using an organic conductive material, instead of metal, in inner electrodes.

However, because thermal spraying of the conductive material may melt the electrodes and the films, it is difficult to ensure connection with the inner electrodes in the multilayer body. Also, as the thickness of the electrodes in the multilayer body decreases to several micrometers (μm) or less, it becomes more difficult to cut the films with high precision. When the thickness of the electrodes in the multilayer body becomes as small as 1 μm or less, it is difficult to ensure electrical connection with the inner electrodes through T-shaped connection. A slightly poor connection may cause micro-discharge and degrade the electrodes.

The present disclosure has been made in view of the circumstances described above. An object of the present disclosure is to provide an actuator device and a method for manufacturing the actuator device, which is formed by stacking and rolling films of electrostrictive material into a cylindrical body and can ensure electrical connection with inner electrodes at both end portions of the cylindrical body.

Solution to Problem

To achieve the object described above, an actuator device according to the present disclosure is formed by stacking and rolling two films of electrostrictive material into a cylindrical body, the two films each having an inner electrode on one or both surfaces thereof. The cylindrical body has at least one cut portion at each end portion thereof, the cut portion being configured to reach the inner electrode, and conductive ink is applied to the cut portion.

In the configuration described above, two films made of electrostrictive material and each having an inner electrode on one or both surfaces thereof are stacked and rolled into a cylindrical body. The cylindrical body has at least one cut portion at each end portion thereof, the cut portion being configured to reach the inner electrode, and conductive ink is applied to the cut portion. By applying conductive ink to each of the cut portions, the conductive ink flows through the cut portions and reaches the inner electrodes on the films. By heat-hardening the conductive ink, it is possible to ensure electrical connection between outer and inner electrodes.

In the actuator device according to the present disclosure, the inner electrodes on one or both surfaces of the two films of electrostrictive material are preferably stacked to be shifted from each other in one direction such that the inner electrodes partially overlap each other, and the cylindrical body is preferably formed by rolling the stacked films in a direction intersecting with the one direction.

In the configuration described above, the inner electrodes on one or both surfaces of the two films of electrostrictive material are stacked to be shifted from each other in one direction such that the inner electrodes partially overlap each other, and the cylindrical body is formed by rolling the stacked films in a direction intersecting with the one direction. Thus, positive and negative electrodes can be formed at respective end portions of the cylindrical body, and it is possible to avoid a short circuit between the positive and negative electrodes.

To achieve the object described above, an actuator device manufacturing method according to the present disclosure includes forming an inner electrode on one or both surfaces of each of two films made of electrostrictive material, stacking the two films and rolling the stacked films into a cylindrical body, forming at least one cut portion at each end portion of the cylindrical body such that the cut portion reaches the inner electrode, and applying conductive ink to the cut portion.

In the configuration described above, an inner electrode is formed on one or both surfaces of each of two films made of electrostrictive material, the two films are stacked and rolled into a cylindrical body, at least one cut portion is formed at each end portion of the cylindrical body such that the cut portion reaches the inner electrode, and conductive ink is applied to the cut portion. By applying conductive ink to each of the cut portions, the conductive ink flows through the cut portions and reaches the inner electrodes on the films.

By heat-hardening the conductive ink, it is possible to ensure electrical connection between outer and inner electrodes.

In the actuator device manufacturing method according to the present disclosure, the inner electrodes on one or both surfaces of the two films of electrostrictive material are preferably stacked to be shifted from each other in one direction such that the inner electrodes partially overlap each other, and the cylindrical body is preferably formed by rolling the stacked films in a direction intersecting with the one direction.

In the configuration described above, the inner electrodes on one or both surfaces of the two films of electrostrictive material are stacked to be shifted from each other in one direction such that the inner electrodes partially overlap each other, and the cylindrical body is formed by rolling the stacked films in a direction intersecting with the one direction. Thus, positive and negative electrodes can be formed at respective end portions of the cylindrical body, and it is possible to avoid a short circuit between the positive and negative electrodes.

To achieve the object described above, another actuator device manufacturing method according to the present disclosure includes forming an inner electrode on one or both surfaces of each of two films made of electrostrictive material, stacking the two films and forming at least one cut portion in the stacked films such that the cut portion reaches the inner electrode, applying conductive ink to the cut portion, and forming a cylindrical body by rolling the stacked films such that a surface to which the conductive ink has been applied faces outward.

In the configuration described above, an inner electrode is formed on one or both surfaces of each of two films made of electrostrictive material, the two films are stacked and at least one cut portion is formed in the stacked films such that the cut portion reaches the inner electrode, conductive ink is applied to the cut portion, and a cylindrical body is formed by rolling the stacked films such that a surface to which the conductive ink has been applied faces outward. Since application of the conductive ink to the cut portion is followed by rolling the films to form the cylindrical body, the conductive ink can be easily applied to the cut portion. Since the conductive ink can flow through the cut portion and reach the inner electrode on the films, it is possible to ensure electrical connection between outer and inner electrodes.

In the actuator device manufacturing method according to the present disclosure, the inner electrodes on one or both surfaces of the two films of electrostrictive material are preferably stacked to be shifted from each other in one direction such that the inner electrodes partially overlap each other; and the cut portion is preferably formed at each end portion of the stacked films in the one direction, and the cylindrical body is preferably formed by rolling the stacked films in a direction intersecting with the one direction.

In the configuration described above, the inner electrodes on one or both surfaces of the two films of electrostrictive material are stacked to be shifted from each other in one direction such that the inner electrodes partially overlap each other, the cut portion is formed at each end portion of the stacked films in the one direction, and the cylindrical body is formed by rolling the stacked films in a direction intersecting with the one direction. Thus, positive and negative electrodes can be formed at respective end portions of the cylindrical body, and it is possible to avoid a short circuit between the positive and negative electrodes.

Advantageous Effects of Disclosure

In the configuration described above, by applying conductive ink to each of the cut portions, the conductive ink flows through the cut portions and reaches the inner electrodes on the films. By heat-hardening the conductive ink, it is possible to ensure electrical connection between outer and inner electrodes. Also, the inner electrodes on one or both surfaces of the two films of electrostrictive material are stacked to be shifted from each other in one direction such that the inner electrodes partially overlap each other, the cut portion is formed at each end portion of the stacked films in the one direction, and the cylindrical body is formed by rolling the stacked films in a direction intersecting with the one direction. Thus, positive and negative electrodes can be formed at respective end portions of the cylindrical body, and it is possible to avoid a short circuit between the positive and negative electrodes.

DETAILED DESCRIPTION

Embodiments of the present disclosure will now be described in detail with reference to the drawings. The following embodiments each describe an actuator device which is formed by rolling two electrostrictive films (films) of polymer electrostrictive material into a cylindrical body.

First Embodiment

Figure 1:
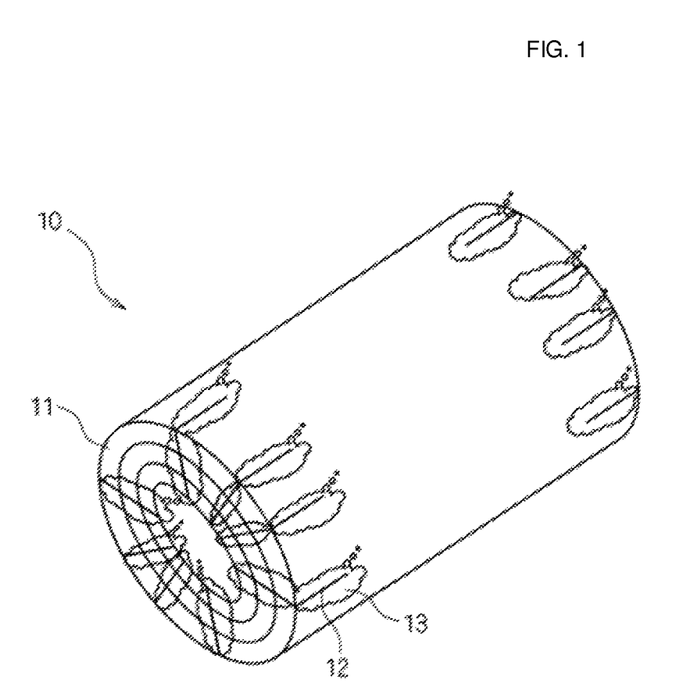
FIG. 1 is a perspective view schematically illustrating a configuration of an actuator device according to a first embodiment of the present disclosure.

FIG. 1 is a perspective view schematically illustrating a configuration of an actuator device according to a first embodiment of the present disclosure. An actuator device 10 according to the first embodiment is formed by stacking two electrostrictive films 11 of polymer electrostrictive material and rolling them into a cylindrical body. The cylindrical body is provided with a plurality of cut portions 12 at both end portions thereof. The cut portions 12 are formed by cutting a cylindrical body 33, at both end portions, radially from the outer periphery of the cylindrical body 33 until inner electrodes on the stacked electrostrictive films 11 are reached.

The cut portions 12 are impregnated with conductive ink 13 by dipping the cut portions 12 into the conductive ink 13 or by applying the conductive ink 13 to the cut portions 12. The conductive ink 13 in the cut portions 12 flows to reach the inner electrodes on the stacked electrostrictive films 11, and is electrically connected to the inner electrodes by heat-hardening the conductive ink 13.

The conductive ink 13 oozing and exposed from the cut portions 12 may be covered with Au conductive paste or Cu conductive paste. Covering the conductive ink 13 with conductive paste makes it possible to provide solid outer electrodes.

Figure 2A:
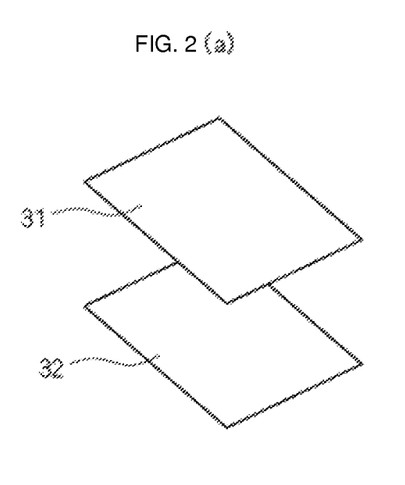
FIGS. 2(a) to 2(c) are perspective views schematically illustrating steps of manufacturing the actuator device according to the first embodiment of the present disclosure.
Figure 2B:
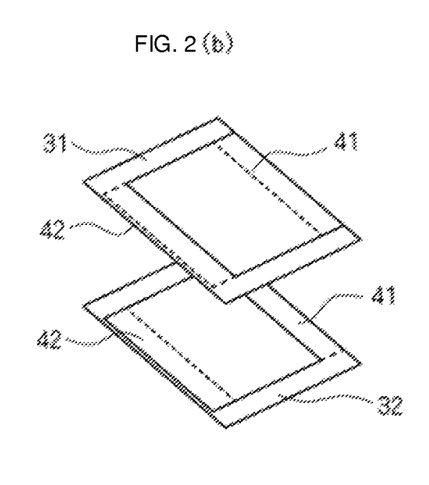
Figure 2C:
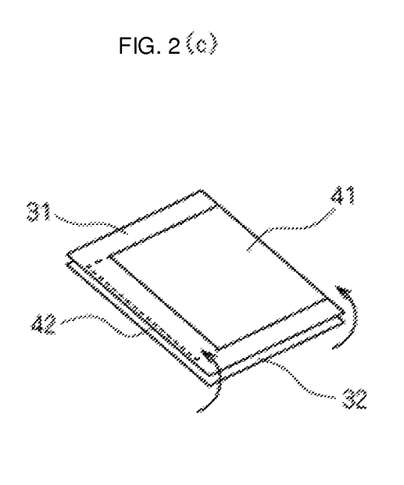
Figures 3A, 3B:
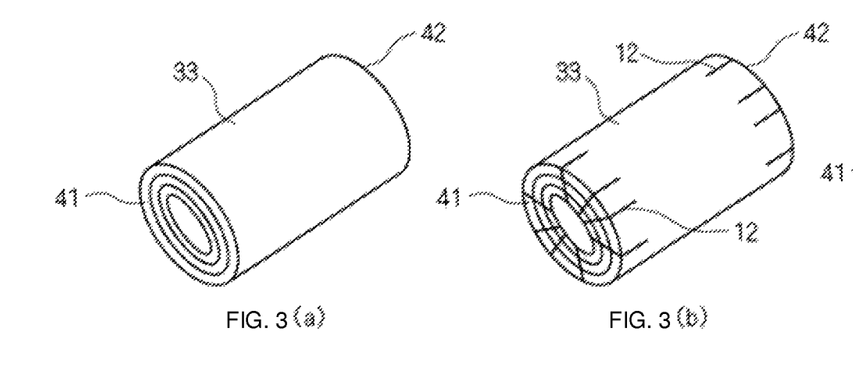
FIGS. 3(a) to 3(d) are perspective views schematically illustrating steps of manufacturing the actuator device according to the first embodiment of the present disclosure.
Figure 3C:
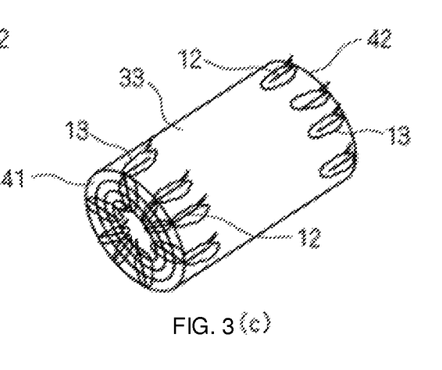
Figure 3D:
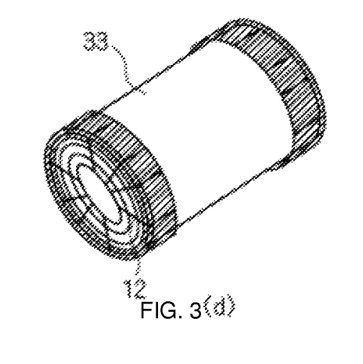

FIG. 2 and FIG. 3 are perspective views schematically illustrating steps of manufacturing the actuator device 10 according to the first embodiment of the present disclosure. First, as illustrated in FIG. 2(a), two electrostrictive films (films) 31 and 32 made of polymer electrostrictive material are prepared. Then, electrode patterns (inner electrodes) 41 and 42 are formed on respective front and back surfaces of each of the two electrostrictive films 31 and 32.

The polymer electrostrictive material that forms the electrostrictive films 31 and 32 is not particularly limited, as long as it is a polymer piezoelectric material having a permanent dipole. For example, the polymer electrostrictive material is preferably polyvinylidene fluoride (PVDF), polyvinylidene fluoride (PVDF) copolymer such as P (VDF-TrFE-HFP), or PVDF terpolymer such as P (VDF-TrFE-CFE), P (VDF-TrFE-CTFE), P (VDF-TrFE-CDFE), P (VDF-TrFE-HFA), P (VDF-TrFE-HFP), P (VDF-TrFE-VC), or P (VDF-VF). Note that P represents poly, VDF represents vinylidene fluoride, TrFE represents trifluoroethylene, CFE represents chlorofluoroethylene, CTFE represents chlorotrifluoroethylene, CDFE represents chlorodifluoroethylene, HFA represents hexafluoroacetone, HFP represents hexafluoropropylene, VC represents vinyl chloride, and VF represents vinyl fluoride.

Using P (VDF-TrFE-CFE) is particularly preferable, because a large strain can be obtained. The thickness of each of the electrostrictive films 31 and 32 may be set to any value, but is preferably, for example, several micrometers (μm) to about 100 μm.

The electrostrictive films 31 and 32 are each formed as a film having a thickness of several micrometers (μm) to about 100 μm. Then as illustrated in FIG. 2(b), the electrode patterns (inner electrodes) 41 and 42 are formed by spraying the conductive ink, through a mask, onto both the front and back surfaces of each of the electrostrictive films 31 and 32. The electrode patterns 41 and 42 may be formed by an inkjet method, brush coating, screen printing, or the like depending on the viscosity of the conductive ink.

As the conductive ink 13, an organic conductive material, such as polyethylenedioxythiophene (PEDOT), polypyrrole (PPy), or polyaniline (PANI), is used. The conductive ink 13 is used by dissolving it in a solvent, together with an organic binder. Examples of the organic binder include a gelatin binder, an acrylic binder, and a polyvinyl alcohol binder. The solvent may be selected from those, such as methanol and ethanol, that can dissolve an organic conductive material together with an organic binder.

On the front and back surfaces of each of the two electrostrictive films 31 and 32, the electrode patterns 41 and 42 are preferably formed to be aligned with opposite sides. Thus, when the two electrostrictive films 31 and 32 each having the electrode patterns 41 and 42 on the respective front and back surfaces thereof are stacked together, the electrode patterns 41 and 42 are exposed to opposite sides, on the inside where the two electrostrictive films 31 and 32 are in contact with each other and the outside where the electrostrictive films 31 and 32 are not in contact. In the example of FIG. 2(c), the electrode patterns 42 on the inside where the two electrostrictive films 31 and 32 are in contact with each other can be exposed to the left side of the electrostrictive films 31 and 32, and the electrode patterns 41 on the outside where the electrostrictive films 31 and 32 are not in contact can be exposed to the right side of the electrostrictive films 31 and 32. Therefore, the electrode patterns 41 and 42 having different polarities can be exposed to opposite end portions, and it is possible to avoid a short circuit between electrodes (positive and negative electrodes).

The two electrostrictive films 31 and 32 are stacked together and rolled in a direction of arrows in FIG. 2(c) to form the cylindrical body 33. The electrostrictive films 31 and 32 are rolled about a direction orthogonal to the sides with which the electrode patterns 41 are 42 are aligned, that is, about the direction (one direction) in which the electrode patterns 41 and 42 partially overlap each other. Note that the direction of arrows in FIG. 2(c) intersects with the one direction.

FIG. 3(a) is a perspective view illustrating the cylindrical body 33 formed by rolling the electrostrictive films 31 and 32 in the direction of arrows in FIG. 2(c). In the cylindrical body 33 formed by rolling the electrostrictive films 31 and 32 stacked together, the electrode patterns 41 are exposed to one end portion and the electrode patterns 42 are exposed to the other end portion. The electrostrictive films 31 and 32 may be of any size. The length of the cylindrical body 33 formed by rolling the electrostrictive films 31 and 32 is preferably 10 mm or more, and the length of the electrostrictive films 31 and 32 to be rolled is preferably several times the circumferential length of the cylindrical body 33. The cylindrical body 33 is 0.3 mm or more in diameter.

Next, as illustrated in FIG. 3(b), the cylindrical body 33 is provided with the plurality of cut portions 12 at both end portions thereof. The cut portions 12 are formed by cutting the cylindrical body 33, at both end portions, radially from the outer periphery of the cylindrical body 33 until the inner electrodes on the electrostrictive films 31 and 32 stacked together are reached. The cut portions 12 do not reach a region where the electrode patterns 41 and the electrode patterns 42 overlap each other. This prevents the electrode patterns 41 and the electrode patterns 42 from being short-circuited by the conductive ink 13 that enters through the cut portions 12.

Next, as illustrated in FIG. 3(c), the cut portions 12 are impregnated with the conductive ink 13 by dipping the cut portions 12 into the conductive ink 13 or by applying the conductive ink 13 to the cut portions 12. The conductive ink in the cut portions 12 flows to reliably reach the electrode patterns 41 or the electrode patterns 42 serving as inner electrodes, and is electrically connected to the electrode patterns 41 or the electrode patterns 42 by heat-hardening the conductive ink 13.

In the first embodiment, as illustrated in FIG. 3(d), the conductive ink 13 is applied to the peripheries of both the end portions of the cylindrical body 33 to cover the conductive ink 13 oozing and exposed from the cut portions 12. The entire peripheries of both the end portions of the cylindrical body 33 can function as outer electrodes by heat-hardening the conductive ink 13. Instead of the conductive ink 13, metal paste, such as silver paste, may be applied to the peripheries of both the end portions of the cylindrical body 33 to cover the conductive ink 13 oozing and exposed from the cut portions 12.

According to the first embodiment, as described above, after the electrode patterns 41 and 42 are formed as inner electrodes on the respective front and back surfaces of each of the two electrostrictive films 31 and 32 made of polymer electrostrictive material, the electrostrictive films 31 and 32 are stacked together and rolled into the cylindrical body 33. The plurality of cut portions 12 are formed at both end portions of the cylindrical body 33 to reach the electrode patterns 41 and 42. The cut portions 12 are applied with or dipped into the conductive ink 13. By applying the conductive ink 13 to the cut portions 12 or dipping the cut portions 12 into the conductive ink 13, the conductive ink 13 flows through the cut portions 12 and reaches the inner electrodes on the electrostrictive films 31 and 32. By heat-hardening the conductive ink 13, it is possible to ensure electrical connection between the outer electrode and the inner electrodes (the electrode patterns 41 or the electrode patterns 42).

Although a plurality of cut portions 12 are provided in the first embodiment described above, at least one cut portion 12 may be provided, as long as it is possible to ensure electrical connection between the outer electrode and the inner electrodes (the electrode patterns 41 or the electrode patterns 42). With the plurality of cut portions 12, however, even if poor electrical connection occurs in some part, conductive characteristics between the outer and inner electrodes are not impaired. Therefore, it is obviously preferable that a plurality of cut portions 12 be provided.

Second Embodiment

A configuration of an actuator device according to a second embodiment of the present disclosure is similar to that in the first embodiment, and its detailed description will be omitted by assigning the same reference numerals to the corresponding components. The second embodiment differs from the first embodiment in the timing of forming cut portions.

Figure 4A:
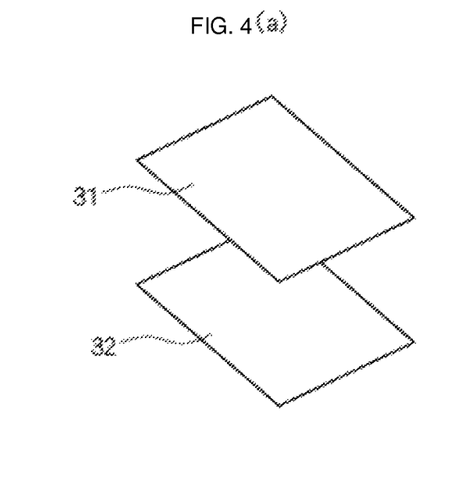
FIGS. 4(a) to 4(c) are perspective views schematically illustrating steps of manufacturing an actuator device according to a second embodiment of the present disclosure.
Figure 4B:
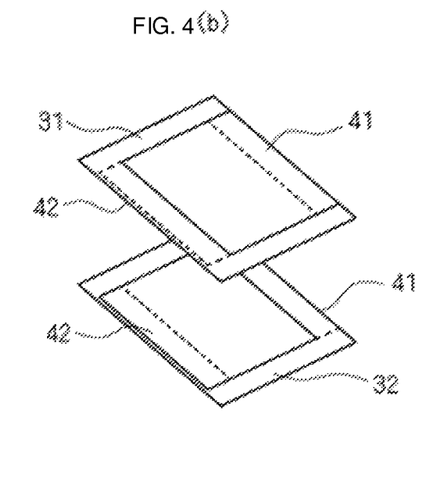
Figure 4C:
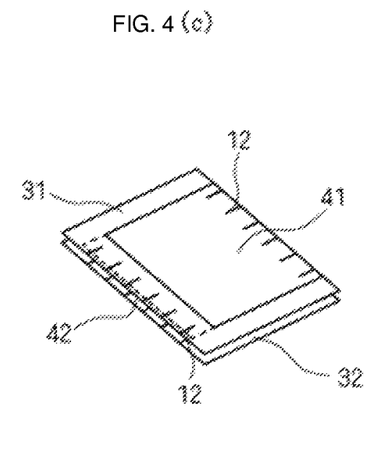
Figure 5A:
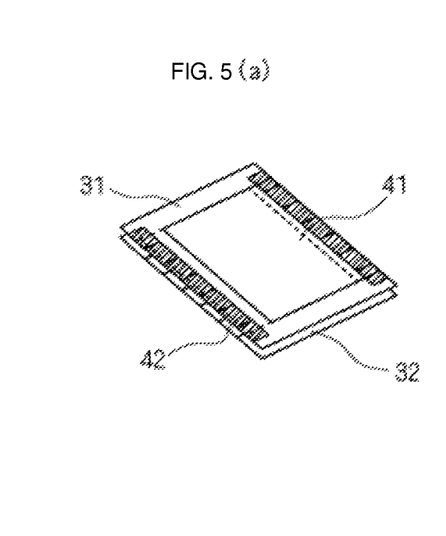
FIGS. 5(a) to 5(c) are perspective views schematically illustrating steps of manufacturing the actuator device according to the second embodiment of the present disclosure.
Figure 5B:
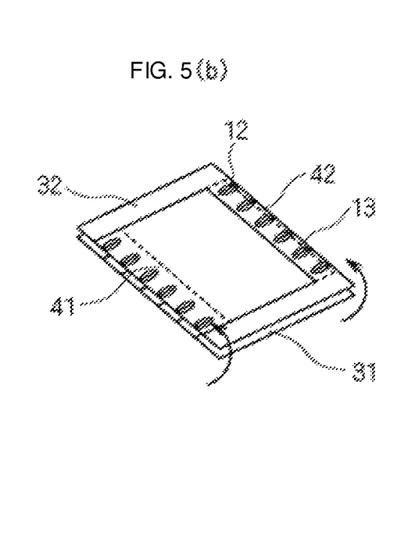
Figure 5C:
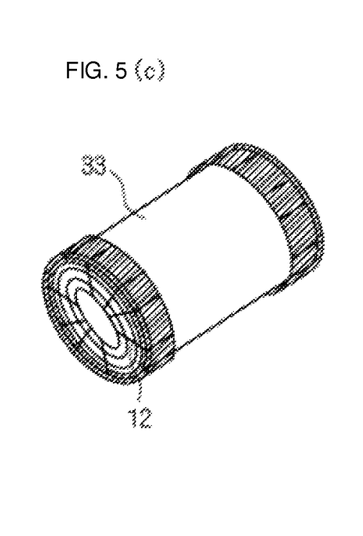

FIG. 4 and FIG. 5 are perspective views schematically illustrating steps of manufacturing the actuator device 10 according to the second embodiment of the present disclosure. First, as illustrated in FIG. 4(a), two electrostrictive films (films) 31 and 32 made of polymer electrostrictive material are prepared. Then, electrode patterns (inner electrodes) 41 and 42 are formed on respective front and back surfaces of each of the two electrostrictive films 31 and 32.

The electrostrictive films 31 and 32 are each formed as a film having a thickness of several micrometers (μm) to about 100 μm. As illustrated in FIG. 4(b), the electrode patterns (inner electrodes) 41 and 42 are formed by spraying the conductive ink 13, through a mask, onto both the front and back surfaces of each of the electrostrictive films 31 and 32. The electrode patterns 41 and 42 may be formed by an inkjet method, brush coating, screen printing, or the like depending on the viscosity of the conductive ink 13.

On the front and back surfaces of each of the two electrostrictive films 31 and 32, the electrode patterns 41 and 42 are preferably formed to be aligned with opposite sides. Thus, when the two electrostrictive films 31 and 32 each having the electrode patterns 41 and 42 on the respective front and back surfaces thereof are stacked together, the electrode patterns 41 and 42 are exposed to opposite sides, on the inside where the two electrostrictive films 31 and 32 are in contact with each other and the outside where the electrostrictive films 31 and 32 are not in contact. In the example of FIG. 4(c), the electrode patterns 42 on the inside where the two electrostrictive films 31 and 32 are in contact with each other can be exposed to the left side of the electrostrictive films 31 and 32, and the electrode patterns 41 on the outside where the electrostrictive films 31 and 32 are not in contact can be exposed to the right side of the electrostrictive films 31 and 32. Therefore, the electrode patterns 41 and 42 having different polarities can be exposed to opposite end portions, and it is possible to avoid a short circuit between electrodes (positive and negative electrodes).

Next, as illustrated in FIG. 4(c), with the two electrostrictive films 31 and 32 stacked together, a plurality of cut portions 12 are formed on each side with which the electrode patterns 41 or 42 are aligned. The cut portions 12 do not reach a region where the electrode patterns 41 and the electrode patterns 42 overlap each other. This prevents the electrode patterns 41 and the electrode patterns 42 from being short-circuited by the conductive ink 13 that enters through the cut portions 12.

Next, as illustrated in FIG. 5(a), the cut portions 12 are impregnated with the conductive ink 13 by dipping the cut portions 12 into the conductive ink 13 or by applying the conductive ink 13 to the cut portions 12. The conductive ink in the cut portions 12 flows to reliably reach the electrode patterns 41 or the electrode patterns 42 serving as inner electrodes, and is electrically connected to the electrode patterns 41 or the electrode patterns 42 by heat-hardening the conductive ink 13.

After the conductive ink 13 is applied to the electrostrictive films 31 and 32 stacked together, the electrostrictive films 31 and 32 are turned upside down as illustrated in FIG. 5(b). Thus, when the electrostrictive films 31 and 32 stacked together are rolled into the cylindrical body 33, a surface where the conductive ink 13 has been applied to the cut portions 12 faces outward.

As illustrated in FIG. 5(b), the electrostrictive films 31 and 32 are rolled in a direction of arrows to form the cylindrical body 33. The electrostrictive films 31 and 32 are rolled about a direction orthogonal to the sides with which the electrode patterns 41 and 42 are aligned, that is, about the direction (one direction) in which the electrode patterns 41 and 42 partially overlap each other. Note that the direction of arrows in FIG. 5(b) intersects with the one direction.

FIG. 5(c) is a perspective view illustrating the cylindrical body 33 formed by rolling the electrostrictive films 31 and 32 in the direction of arrows in FIG. 5(b). In the cylindrical body 33 formed by rolling the electrostrictive films 31 and 32 stacked together, the conductive ink 13 applied is electrically connected to the electrode patterns 41 or the electrode patterns 42 on the periphery of each end portion.

In the second embodiment, the entire peripheries of both the end portions of the cylindrical body 33 can function as outer electrodes by heat-hardening the conductive ink 13. Instead of the conductive ink 13, metal paste, such as silver paste, may be applied to the peripheries of both the end portions of the cylindrical body 33 to cover the conductive ink 13 oozing and exposed from the cut portions 12.

According to the second embodiment, as described above, after the two electrostrictive films 31 and 32 made of polymer electrostrictive material are stacked together, one or more cut portions 12 are formed to reach the inner electrodes, and the conductive ink 13 is applied to the cut portions 12. The electrostrictive films 31 and 32 are rolled into the cylindrical body 33 such that a surface where the conductive ink 13 has been applied faces outward. Since application of the conductive ink 13 to the cut portions 12 is followed by rolling the electrostrictive films 31 and 32 to form the cylindrical body 33, the conductive ink 13 can be easily applied to the cut portions 12. Since the conductive ink 13 can flow through the cut portions 12 and reach the inner electrodes on the electrostrictive films 31 and 32, it is possible to ensure electrical connection between the outer electrode and the inner electrodes (the electrode patterns 41 or the electrode patterns 42).

Although a plurality of cut portions 12 are provided in the second embodiment described above, at least one cut portion 12 may be provided, as long as it is possible to ensure electrical connection between the outer electrode and the inner electrodes (the electrode patterns 41 or the electrode patterns 42). With the plurality of cut portions 12, however, even if poor electrical connection occurs in some part, conductive characteristics between the outer and inner electrodes are not impaired. Therefore, it is obviously preferable that a plurality of cut portions 12 be provided.

The present disclosure is not limited to the embodiments described above, and various modifications and replacements are obviously possible within the scope of the present disclosure. For example, in the first and second embodiments described above, the inner electrodes are formed by applying the conductive ink 13 to both the front and back surfaces of each of the electrostrictive films 31 and 32. Alternatively, films of metal, such as nickel (Ni), platinum (Pt), platinum-palladium alloy (Pt—Pd), aluminum (Al), gold (Au), or gold palladium alloy (Au—Pd), may be formed by vapor deposition or sputtering as in the related art.

In the first and second embodiments described above, the electrode patterns 41 and 42 are formed on the respective front and back surfaces of each of the two electrostrictive films 31 and 32. Alternatively, the electrode patterns 41 and 42 may be formed, for example, only on the respective front (or back) surfaces of the two electrostrictive films 31 and 32, which are then stacked together. As a results, the electrode pattern 42 can be exposed to the left side of the electrostrictive film 32 on the inside where the two electrostrictive films 31 and 32 are in contact with each other, and the electrode pattern 41 can be exposed to the right side of the electrostrictive film 31 on the outside (opposite side) where the electrostrictive films 31 and 32 are not in contact. Thus, the electrode patterns 41 and 42 having different polarities can be exposed to opposite sides.

The invention claimed is:

1. An actuator device comprising
two films of electrostrictive material stacked and rolled into a cylindrical body, the two films each having an inner electrode on one or both surfaces thereof, the inner electrodes of the two films including first and second inner electrodes which have different polarities and do not overlap within a region in a stacking direction,
the cylindrical body having at least one cut portion at each end portion thereof, the cut portion being configured to reach the inner electrode, extend through the two films in the stacking direction, and be provided within the region where the first and second inner electrodes do not overlap in the stacking direction; and
conductive ink applied to the cut portion.

2. The actuator device according to claim 1, wherein the inner electrodes on one or both surfaces of the two films of electrostrictive material are stacked to be shifted from each other in one direction such that the inner electrodes partially overlap each other; and
the cylindrical body is formed by rolling the stacked films in a direction intersecting with the one direction.

3. An actuator device manufacturing method comprising:
forming an inner electrode on one or both surfaces of each of two films made of electrostrictive material, the inner electrodes of the two films including first and second inner electrodes which have different polarities and do not overlap within a region in a stacking direction;
stacking the two films and rolling the stacked films into a cylindrical body;
forming at least one cut portion at each end portion of the cylindrical body such that the cut portion reaches the inner electrode, extends through the two films in the stacking direction, and is provided within the region where the first and second inner electrodes do not overlap in the stacking direction; and
applying conductive ink to the cut portion.

4. The actuator device manufacturing method according to claim 3, wherein the inner electrodes on one or both surfaces of the two films of electrostrictive material are stacked to be shifted from each other in one direction such that the inner electrodes partially overlap each other; and
the cylindrical body is formed by rolling the stacked films in a direction intersecting with the one direction.

5. An actuator device manufacturing method comprising:
forming an inner electrode on one or both surfaces of each of two films made of electrostrictive material, the inner electrodes of the two films including first and second inner electrodes which have different polarities and do not overlap within a region in a stacking direction;
stacking the two films and forming at least one cut portion in the stacked films such that the cut portion reaches the inner electrode, extends through the two films in the stacking direction, and is provided within the region where the first and second inner electrodes do not overlap in the stacking direction;
applying conductive ink to the cut portion; and
forming a cylindrical body by rolling the stacked films such that a surface to which the conductive ink has been applied faces outward.

6. The actuator device manufacturing method according to claim 5, wherein the inner electrodes on one or both surfaces of the two films of electrostrictive material are stacked to be shifted from each other in one direction such that the inner electrodes partially overlap each other; and
the cut portion is formed at each end portion of the stacked films in the one direction, and the cylindrical body is formed by rolling the stacked films in a direction intersecting with the one direction.

* * * * *